(12) United States Patent
Yoshie (10) Patent No.: US 7,572,333 B2
(45) Date of Patent: Aug. 11, 2009

(54) METHOD FOR MANUFACTURING SEMICONDUCTOR DEVICE

(75) Inventor: Toru Yoshie, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 469 days.

(21) Appl. No.: 11/405,569

(22) Filed: Apr. 18, 2006

(65) Prior Publication Data

US 2006/0240574 A1 Oct. 26, 2006

(30) Foreign Application Priority Data

Apr. 20, 2005 (JP) ............................... 2005-121763

(51) Int. Cl.
*C30B 25/12* (2006.01)
(52) U.S. Cl. ............................ 117/95; 117/84; 117/89; 117/97; 219/460.1
(58) Field of Classification Search .................. 117/84, 117/89, 95, 97; 219/460.1
See application file for complete search history.

(56) References Cited

U.S. PATENT DOCUMENTS 6,471,770 B2 * 10/2002 Koike et al. .................. 117/97
6,679,947 B2 * 1/2004 Koike et al. .................. 117/97

FOREIGN PATENT DOCUMENTS

JP 10-070313 10/1998

* cited by examiner

*Primary Examiner*—Felisa C Hiteshew
(74) *Attorney, Agent, or Firm*—Volentine & Whitt, P.L.L.C.

(57) ABSTRACT

A semiconductor manufacturing apparatus includes a hot plate which heats a sapphire substrate; a support table having a support plate disposed as being spaced away from the hot plate by a predetermined interval, and having support portions which respectively support the sapphire substrate while being spaced by a predetermined interval between the hot plate and the support plate and which support the sapphire substrate in such a manner that back surfaces of the hot plate and the sapphire substrate are opposite to each other; an elevating device which moves the support table up and down; and a shielding cover which externally blocks off spacing defined between the hot plate and the sapphire substrate and spacing defined between the sapphire substrate and the support plate.

12 Claims, 7 Drawing Sheets

METHOD FOR MANUFACTURING SEMICONDUCTOR DEVICE

BACKGROUND OF THE INVENTION

The present invention relates to a semiconductor manufacturing apparatus employed in a process necessary to heat a sapphire substrate in a process for manufacturing a semiconductor device by the sapphire substrate or a sapphire wafer using the same, and a method for manufacturing the semiconductor device.

A semiconductor device manufactured by a sapphire wafer in which silicon (Si) or the like has been epitaxially grown on a sapphire ($Al_2O_3$) substrate, is capable of greatly improving characteristics of a transistor by effects such as a reduction in parasitic capacitance, etc. as compared with a transistor of a semiconductor device manufactured by a silicon wafer using a silicon substrate.

Generally, a process for manufacturing a semiconductor device using a sapphire wafer can substantially follow a process for manufacturing a semiconductor device using a silicon wafer. A semiconductor manufacturing apparatus is shared and its manufacturing process can be produced at low cost.

Thus, when the manufacturing process using the silicon wafer is diverted to the manufacturing process using the sapphire wafer, a problem arises which results from the fact that the sapphire substrate is low in thermal conductivity as compared with the silicon substrate and thermal absorption efficiency is low due to non-absorption of light in a range from visible light to infrared light.

In the conventional semiconductor device, as to the low thermal absorption efficiency, an optical absorption body or a conductor is closely formed on the back surface of the sapphire wafer, and the sapphire substrate is radiant-heated or induction-heated by a lamp heating method or a high-frequency induction heating method to thereby efficiently heat the sapphire substrate (refer to, for example, a patent document 1 (Japanese Unexamined Patent Publication No. Hei 10(1998)-70313 (paragraph 0019 in page 4 to paragraph 0032 in page 5, FIG. 4 and FIG. 5)).

However, the above related art is accompanied by problems that in an atmospheric-pressure CVD apparatus employed in a manufacturing process in which since the sapphire substrate is heated from the back surface of the sapphire wafer, an atmosphere temperature in the corresponding process is low and the heating of the sapphire substrate is necessary, e.g., a process based on an atmospheric-pressure CVD (Chemical Vapor Deposition) method, a difference in temperature occurs between the front and back surfaces of the sapphire substrate due to the fact that the thermal conductivity of the sapphire substrate is low, warpage in the form of such a bowl that a peripheral edge portion of the sapphire wafer is lifted occurs in the sapphire wafer on a hot plate, and hence the apparatus encounters difficulties in sucking and holding the sapphire wafer by vacuum upon transfer or the like thereof.

In order to track down the cause of such warpage, the present inventors have carried out the following check tests.

FIG. 10 is an explanatory view showing the manner of warpage of a sapphire substrate.

In FIG. 10, reference numeral 1 indicates a sapphire substrate used as a substrate, which is a circular thin plate formed of a sapphire crystal.

Reference numeral 51 indicates a heating or hot plate which is heated by a heater 52. It is an experimental heating plate having the function of heating the sapphire substrate 1 placed on its upper surface.

Reference numeral 53 indicates a room temperature plate which is placed in a room and has the function of holding its atmosphere temperature, i.e., a temperature equivalent to the room temperature.

The atmosphere temperature is set to the room temperature and the heating plate 51 is heated by the heater 52 to set its temperature to 350° C. Thereafter, the warpage of the sapphire substrate 1 placed on the heating plate 51 was observed.

Figure 10A:
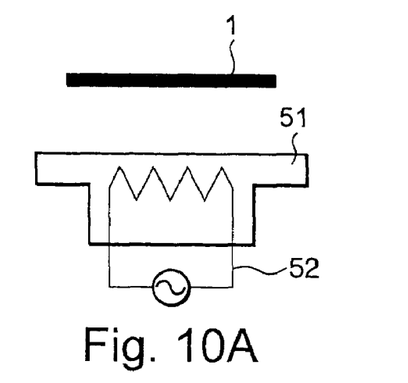
FIG. 10 is an explanatory view showing the manner of warpage of a sapphire substrate.

That is, the back surface of the flat sapphire substrate 1 is placed on the upper surface of the heating plate 51 (FIG. 10(a)). The sapphire substrate 1 begins to warp in bowl form from immediately after its placement. When 10 seconds or so have elapsed, only its central portion is brought into a state of being warped into bowl form in which it is placed in a state of contacting the upper surface of the heating plate 51 (FIG. 10(b)). This is because since the thermal conductivity of the sapphire substrate 1 is low, a temperature distribution occurs in the direction of thickness of the sapphire substrate 1, and the temperature of the heated back surface becomes high and the temperature of the front surface subjected to the atmosphere temperature becomes low, so that the difference in thermal expansion between the front and back surfaces of the sapphire substrate 1 occurs, whereby the sapphire substrate 1 is pulled to the front surface side small in elongation to thereby lift a peripheral edge portion of the sapphire substrate 1.

Figure 10B:
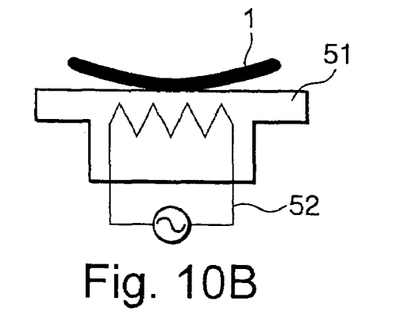
Figure 10C:
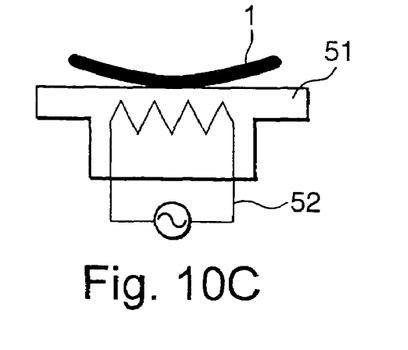

Thereafter, the warpage was held as it is even after the sapphire substrate 1 was left behind for 5 minutes or more (FIG. 10(c)). This is because only the central portion of the back surface of the sapphire substrate 1 placed in contact is thermally expanded by heating, and even though the peripheral edge portion is cooled, the sapphire substrate 1 cannot be restored to its original flat plate due to its thermal expansion.

Figure 10D:
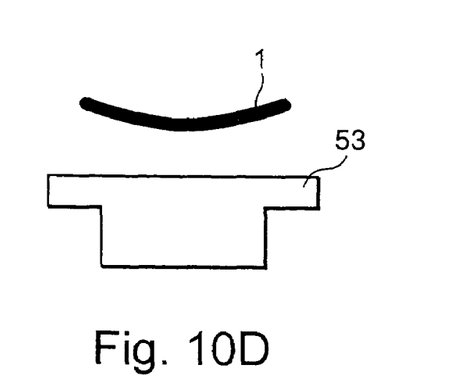
Figure 10E:
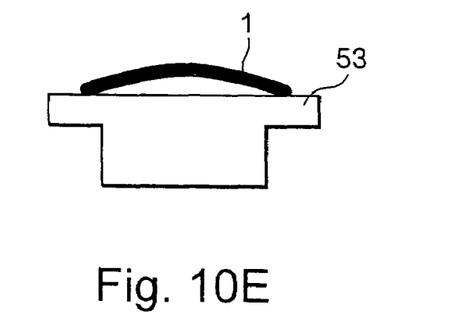
Figure 10F:
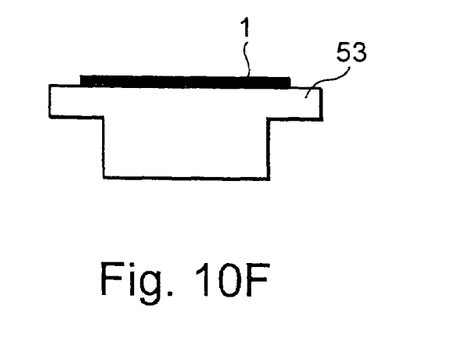

When the sapphire substrate 1 heated in this way is placed on the upper surface of the room temperature plate 53 from its back surface while it is being held in the bowl form (FIG. 10(d)), the manner of its warpage is reversed at the moment of its placement, so that the sapphire substrate 1 is brought to warpage in the form of such a hanging bell that the central portion of the sapphire substrate 1 is raised (FIG. 10(e)). This is because since the central portion of the back surface of the convex sapphire substrate 1 is suddenly cooled by the room temperature plate 53 and thereby its temperature becomes lower than the temperature of the peripheral edge portion of the sapphire substrate 1, the central portion on the back surface side is shrunk and the elongation on the back surface side is reduced, so that the sapphire substrate 1 is pulled thereby to lift the central portion of the sapphire substrate 1.

Thereafter, when the sapphire substrate 1 is left as it is for a few minutes, the entire sapphire substrate 1 is cooled and brought to the room temperature, whereby the sapphire substrate 1 is restored to the original flat plate form.

Next, the heating plate set to 400° C. is provided at a position spaced away from the back surface of the sapphire substrate 1 by 5 mm, and the influence of heating under noncontact in an atmospheric state was confirmed.

Figure 11:
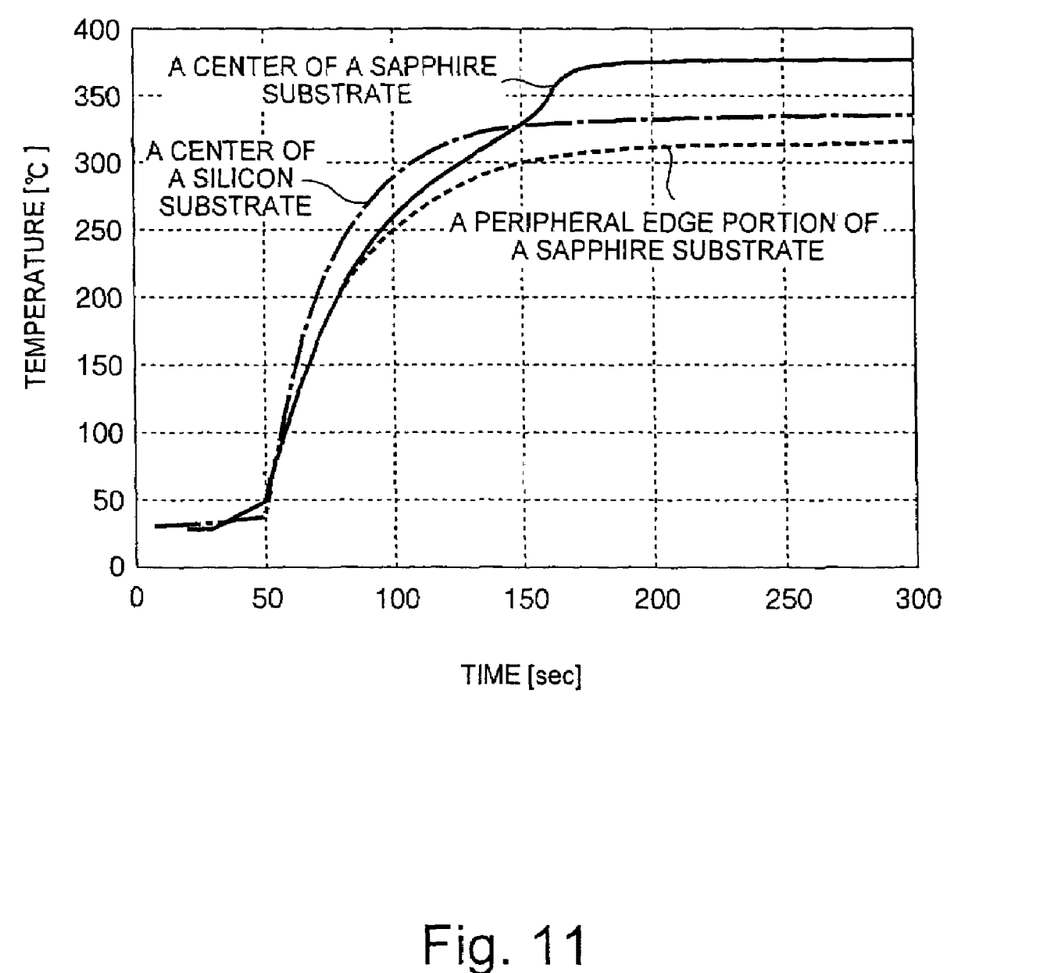
FIG. 11 is a graph illustrating a change in temperature of a sapphire substrate heated in non-contact form.

FIG. 11 is a graph showing changes in temperature of the sapphire substrate heated in non-contact form.

In FIG. 11, the measurement of temperatures is performed using thermocouples embedded into the center of the front surface of the sapphire substrate 1 and its peripheral edge portion. A change in the temperature of the center with the elapse of time is indicated by a solid line and a change in the temperature of the peripheral edge portion is indicated by a broken line. For comparison, a change in the temperature of the center of a silicon substrate heated in like manner is indicated by a dashed line.

It is understood that while a rise in the temperature of the sapphire substrate 1 is slow as compared with the silicon substrate as shown in FIG. 11, a rise in the temperature of the center becomes fast from a point at which the temperature of the front surface of the sapphire substrate 1 exceeds the neighborhood of 200° C., and the temperature thereof suddenly rises at a point where the temperature thereof exceeds the neighborhood of 300° C., thereby reaching 380° C. The temperature of the peripheral edge portion of the sapphire substrate 1 is stable in the neighborhood of 300° C., and the change in temperature like the center of the sapphire substrate 1 does not appear in the change in the temperature of the center of the silicon substrate.

This shows that even in the case of heating based on the noncontact form, if heating is done from one surface alone, then heat is transferred to the surface (back surface in the above) on the side near the heating plate by heat transfer via air from the heating plate, so a difference in temperature occurs between the surface on the side near the heating plate and the surface (front surface) on the opposite side subjected to the room temperature, whereby warpage in the form of a bowl occurs in the sapphire substrate 1 in a manner similar to the case shown in FIG. 10(b), and its central portion approaches the heating plate so that a rise in temperature becomes fast, eventually resulting in contact of its central portion with the heating plate. When the sapphire substrate or the sapphire wafer is heated in contact or non-contact state from one surface in the process low in atmosphere temperature, similar warpage occurs even in the technique disclosed in the patent document 1.

Incidentally, the above warpage occurs in like manner even though the front and back surfaces are reversed. Even in the case of a sapphire wafer in which a device forming layer is formed in a sapphire substrate, similar warpage occurs.

SUMMARY OF THE INVENTION

The present invention has been made to solve the above problems. It is therefore an object of the present invention to provide means which suppresses warpage of a sapphire substrate or the like in a semiconductor manufacturing apparatus employed in a process necessary to heat a sapphire substrate or the like.

According to one aspect of the present invention, for attaining the above object, there is provided a semiconductor manufacturing apparatus which comprises a hot plate which heats a sapphire substrate; a support table having a support plate disposed with being spaced away from the hot plate by a predetermined interval, and support portions which respectively support the sapphire substrate with being spaced by a predetermined interval between the hot plate and the support plate and support the sapphire substrate in such a manner that back surfaces of the hot plate and the sapphire substrate are opposite to each other; an elevating device which moves the support table up and down; and a shielding cover which externally blocks off spacing defined between the hot plate and the sapphire substrate and spacing defined between the sapphire substrate and the support plate.

Thus, the present invention can bring about advantageous effects that air in the shielding cover can be blocked off from outside, the sapphire substrate or the like can substantially uniformly be preheated by heat transfer based on the convection of air in the shielding cover, and warpage of the sapphire substrate or the like in a process necessary to heat the sapphire substrate or the like can be suppressed.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of a semiconductor manufacturing apparatus according to the present invention will hereinafter be described with reference to the accompanying drawings.

First Preferred Embodiment

Figure 1:
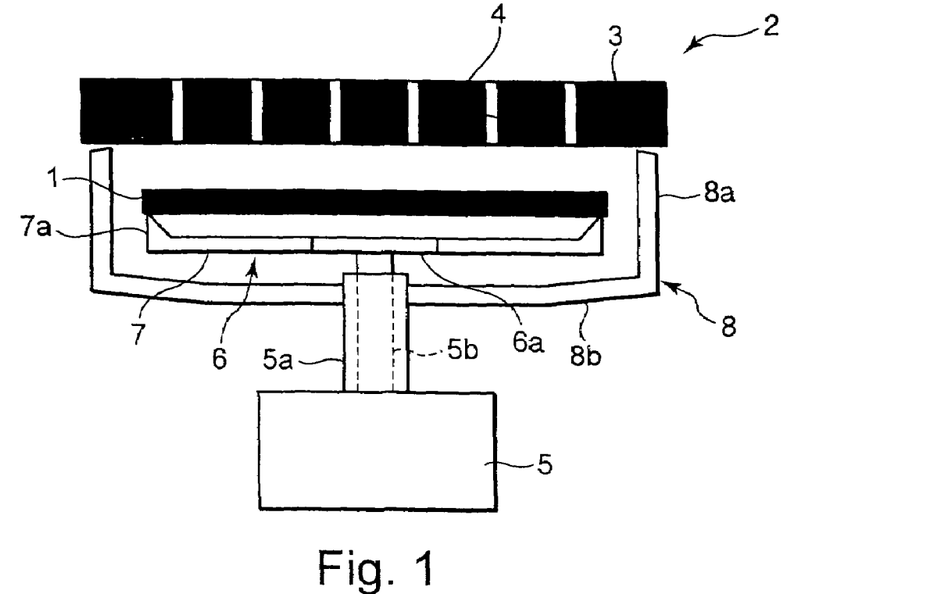
FIG. 1 is an explanatory view showing a section of a semiconductor manufacturing apparatus according to a first embodiment.
Figure 2:
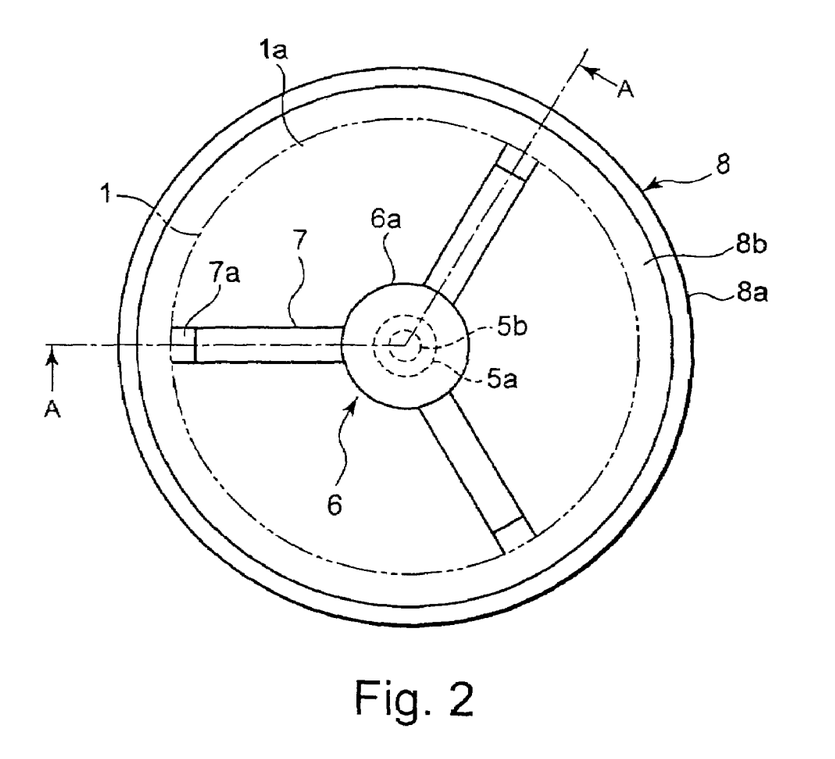
FIG. 2 is an explanatory view illustrating a top surface of the semiconductor manufacturing apparatus according to the first embodiment.

FIG. 1 is an explanatory view showing a section of a semiconductor manufacturing apparatus according to a first embodiment, and FIG. 2 is an explanatory view illustrating a top surface of the semiconductor manufacturing apparatus according to the first embodiment, respectively.

Incidentally, FIG. 1 shows a section taken along sectional line A-A shown in FIG. 2, and FIG. 2 is a top view showing a state in which a hot plate and a sapphire substrate shown in FIG. 1 are omitted. For elements similar to those shown in FIG. 10, the same reference numerals are given, and explanations thereof will be omitted.

In FIGS. 1 and 2, reference numeral 2 indicates the semiconductor manufacturing apparatus, which is a manufacturing apparatus such as an atmospheric-pressure CVD apparatus, which is employed in a process for manufacturing a semiconductor device while heating a sapphire substrate 1 or the like used as a substrate at a relatively low atmosphere temperature.

Reference numeral 3 indicates the hot plate, which is a disk-shaped member heated by an electric heater or the like and opposite to the sapphire substrate 1 at a predetermined interval away therefrom, and which is placed above the sapphire substrate 1. The hot plate 3 heats the sapphire substrate 1 and is also used as a working table for a process work operation of the corresponding process performed while the sapphire substrate 1 is being heated. In the present embodiment, the hot plate 3 has suction holes 4 for sucking or adsorbing and holding the sapphire substrate 1 by vacuum.

Reference numeral 5 indicates an elevating device, which has the function of independently moving up and down a cylindrical outer elevation shaft 5a and an inner elevation shaft 5b slidably disposed thereinside.

Reference numeral 6 indicates a support table which is formed by joining three substantially L-shaped arms 7 to a disk-shaped support plate 6a provided in opposing relationship to the hot plate 3 with being spaced by a predetermined interval away therefrom by welding or the like. The support table 6 is moved up and down by the inner elevation shaft 5b of the elevating device 5 attached to the support table 6 by junctions or the like.

Reference numerals 7a indicate support portions provided at the leading ends or tips of the arms 7, which support a peripheral edge portion 1a (portion meshed in FIG. 2) of the sapphire substrate 1 placed thereon and indicated by a chain double-dashed line in FIG. 2. Further, the support portions 7a respectively support the sapphire substrate 1 at predetermined spacing defined between the hot plate 3 and the support plate 6a and support it in such a manner that the back surfaces of the hot plate 3 and the sapphire substrate 1 are opposite to each other.

Incidentally, the support table 6 may be formed in such a manner that the support plate 6a and the arms 7 become integral with each other. The number of the support portions 7a may be 4 or more.

The region of the sapphire substrate 1, which is supported by the support portions 7a, is not limited to the peripheral edge portion 1a. A region thereof capable of supporting the sapphire substrate 1 without its inclination is enough. The region thereof may not support the same radial position.

Reference numeral 8 indicates a shielding cover elevated by the outer elevation shaft 5a, which is formed of a stainless plate, an aluminum plate, quartz or the like. The shielding cover 8 is constituted of a side face 8a having an inside diameter smaller than the outside diameter of the hot plate 3 and larger than the outside diameter of the support table 6, and a bottom face 8b opposite to the hot plate 3 with the support table 6 interposed therebetween and attached to the outer elevation shaft 5a of the elevating device 5 by junctions or the like. The shielding cover 8 has the function of externally blocking off spacing defined between the hot plate 3 and the sapphire substrate 1 and spacing defined between the sapphire substrate 1 and the support plate 6a.

In FIG. 3, the operation of the above constitution will be explained.

Figure 3A:
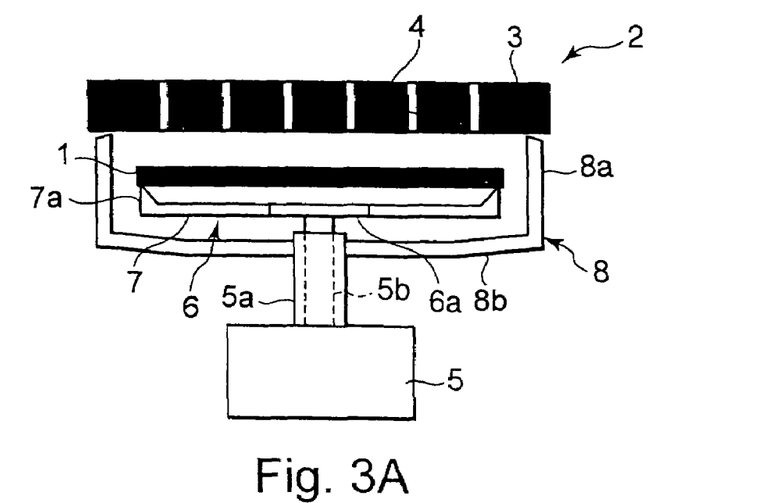
FIG. 3 is an explanatory view showing the operation of the semiconductor manufacturing apparatus according to the first embodiment.

In FIG. 3(a), when the semiconductor device is manufactured by using the semiconductor manufacturing apparatus 2 while warpage of the sapphire substrate 1 is being suppressed, the hot plate 3 for heating the sapphire substrate 1, the support table 6 provided with being spaced by the predetermined interval away from the hot plate 3 provided with the support plate 6a and the support portions 7a, and the elevating device 5 for moving the support table 6 up and down are prepared.

The sapphire substrate 1 is disposed in such a manner that the front surface of the sapphire substrate 1 is turned upside down and caused to be supported by the leading ends of the support portions 7a of the arms 7 of the support table 6 through its peripheral edge portion 1a. To preheat the sapphire substrate 1, the inner elevation shaft 5b is elevated by the elevating device 5 to stop the back surface of the sapphire substrate 1 at a position spaced at an interval of 5 mm or so from the lower surface of the hot plate 3 held at a set temperature of 400° C.

Thus, the sapphire substrate 1 is disposed between the hot plate 3 and the support plate 6a through the support portions 7a with being respectively spaced away from one another by a predetermined interval. The sapphire substrate 1 is disposed in such a manner; that the back surfaces of the hot plate 3 and the sapphire substrate 1 are opposite to each other.

Next, the shielding cover 8 is elevated by the outer elevation shaft 5a to bring the lower surface of the hot plate 3 into contact with the tip of the side face 8a of the shield cover 8.

Thus, the spacing defined between the hot plate 3 and the sapphire substrate 1 and the spacing defined between the sapphire substrate 1 and the support plate 6a are shielded or blocked off from outside. After they have been blocked off from outside, the hot plate 3 is heated up to cause the temperature of the sapphire substrate 1 to rise.

That is, since air around the sapphire substrate 1 is shielded from external air, air lying in the shielding cover 8 heated by the temperature rise of the hot plate 3 is brought into convection and reaches the front surface of the sapphire substrate 1 from between the arms 7 of the support table 6. Thus, the sapphire substrate 1 is substantially uniformly heated by heat transfer from the front and back surfaces of the sapphire substrate 1 to raise the entire sapphire substrate 1 to a substantially uniform temperature, thereby preheating the sapphire substrate 1.

Figure 3B:
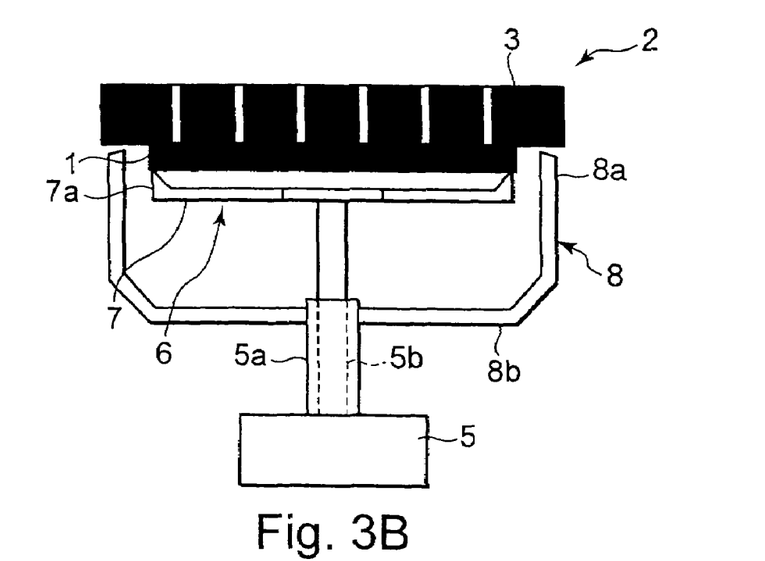

In FIG. 3(b), when the temperature of the front surface of the sapphire substrate 1 is preheated to 320° C. or higher, the inner elevation shaft 5b is elevated to bring the back surface of the sapphire substrate 1 into contact with the lower surface of the hot plate 3, thereby allowing the hot plate 3 to suck and hold the sapphire substrate 1 by vacuum supplied to the suction holes 4 from an unillustrated vacuum pump or the like.

Figure 3C:
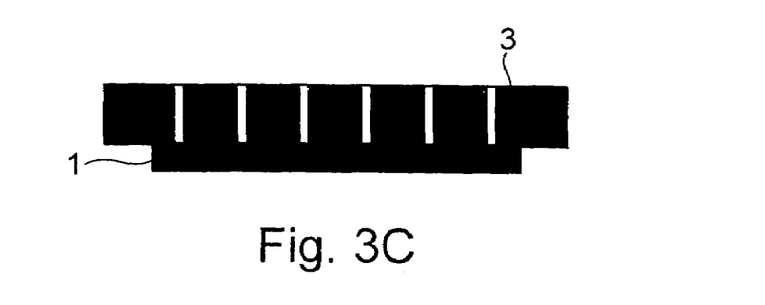

In FIG. 3(c), after the sapphire substrate 1 has been held by the hot plate 3, the inner elevation shaft 5b and the outer elevation shaft 5a are moved downward to retract the support table 6 and the shielding cover 8 from the held sapphire substrate 1, whereby predetermined process work in the corresponding process with respect to the sapphire substrate 1 is started.

In this case, the post-preheat temperature of the sapphire substrate 1 is set to 320° C. or higher, i.e., the difference between the temperature of the sapphire substrate 1 and the set temperature of the hot plate 3 is set to 80° C. or less because the present inventors experimentally have confirmed that if the difference in temperature between the front and back surfaces at the time that the sapphire substrate 1 is brought into contact with the hot plate 3, is within 80° C., then no problem occurs in the suction thereof to the hot plate 3.

Although the interval between the lower surface of the hot plate 3 and the back surface of the sapphire substrate 1 at the preheat has been described above as 5 mm or so, the interval may preferably range from over 1 mm to under 5 mm. This is because if the interval is less than 1 mm, then a region excessively close to the hot plate 3 occurs due to warpage lying within an allowable range, which has occurred upon, for example, the above process and the fabrication of the sapphire substrate 1, so a phenomenon similar to that described using FIG. 11 occurs so that the sapphire substrate 1 and the hot plate 3 might be brought into contact with each other, whereas if the interval exceeds 5 mm, then the efficiency of heat transfer by air brought into convection within the shielding cover 8 is excessively reduced.

Further, it is desirable to apply the semiconductor manufacturing apparatus 2 according to the present embodiment to a process that needs to set the set temperature of the hot plate 3 higher than 300° C. from the atmosphere temperature around the sapphire substrate 1 at being uncovered with the shielding cover 8. This is because if the difference between the atmosphere temperature and the set temperature of the hot plate 3 is less than 300° C., there is then no occurrence of warpage of such a degree that trouble occurs in the suction of the sapphire substrate 1 and the process work in the corresponding process.

Incidentally, although the present embodiment has explained the case in which when the sapphire substrate 1 is covered with the shielding cover 8, the tip of its side face 8a is brought into contact with the lower surface of the hot plate 3, a gap of such a degree that it does not inhibit the convection of air inside the shielding cover 8 may be provided. If done in this way, then wear of the hot plate 3 and the shielding cover 8 due to the above contact or the like is prevented to thereby make it possible to prevent the occurrence of foreign substances.

Inner faces of the side face 8a and bottom face 8b of the shielding cover 8 may preferably be mirror-finished by being given mirror processing. In doing so, heat or thermal rays radiated from the hot plate 3 are reflected by the mirror surfaces so that the sapphire substrate 1 can efficiently be preheated.

In the present embodiment as described above, the sapphire substrate is placed on the support table moved up and down by the elevating device and surrounded by the hot plate and the shielding cover opposite to the sapphire substrate. It is therefore possible to block off or shield air in the shielding cover from outside, substantially uniformly preheating the sapphire substrate by heat transfer based on the convection of air in the shielding cover. Hence, the warpage of the sapphire substrate in the process that needs to heat the sapphire substrate is suppressed, so that the efficiency of the corresponding process can be enhanced.

With the setting of the inner faces of the shielding cover to the mirror-finished surface, the mirror surfaces reflect the heat rays radiated from the hot plate so that the sapphire substrate can efficiently be preheated.

Second Preferred Embodiment

Figure 4:
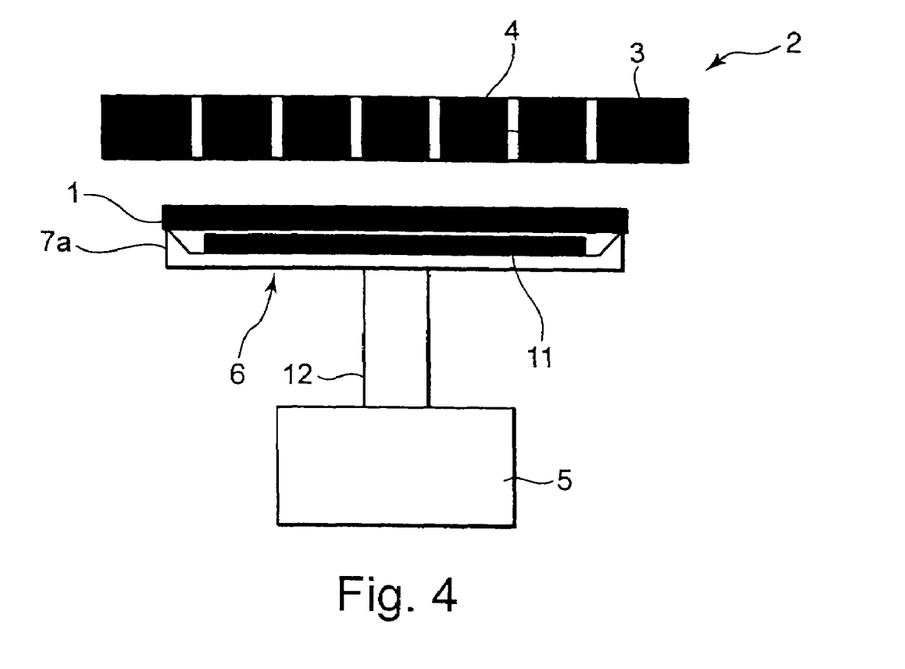
FIG. 4 is an explanatory view showing a section of a semiconductor manufacturing apparatus according to a second embodiment.
Figure 5:
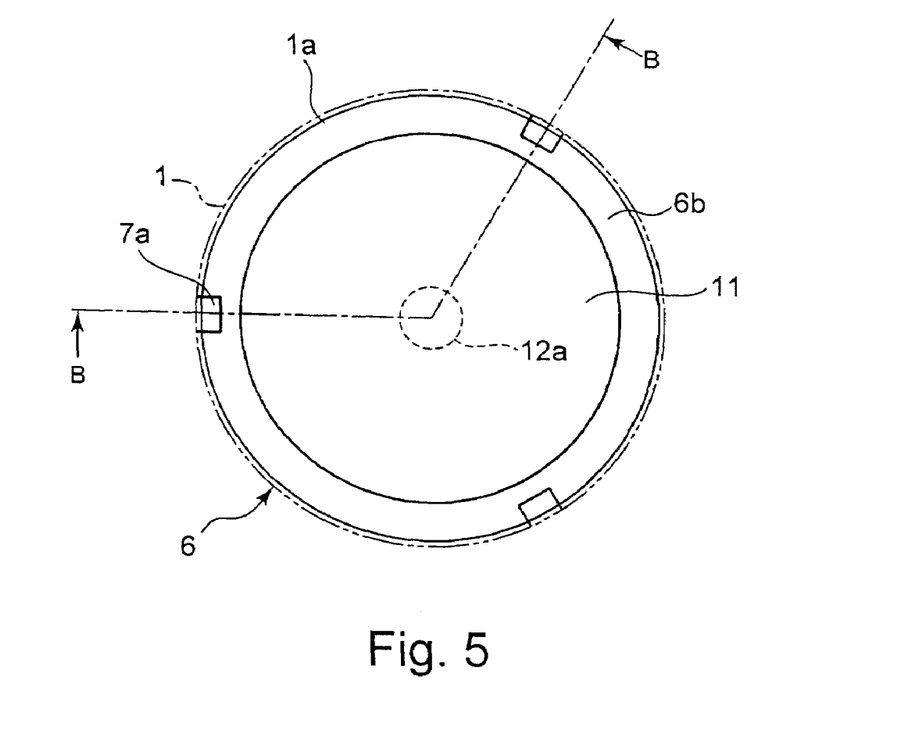
FIG. 5 is an explanatory view illustrating a top surface of the semiconductor manufacturing apparatus according to the second embodiment.

FIG. 4 is an explanatory view showing a section of a semiconductor manufacturing apparatus according to a second embodiment, and FIG. 5 is an explanatory view showing a top surface of the semiconductor manufacturing apparatus according to the second embodiment, respectively.

Incidentally, FIG. 4 shows a section taken along sectional line B-B shown in FIG. 5, and FIG. 5 is a top view showing a state in which the hot plate and sapphire substrate shown in FIG. 2 are excluded. For elements similar to those employed in the first embodiment, the same reference numerals are given and their explanations will be omitted.

In FIGS. 4 and 5, reference numeral 11 indicates a preheat plate, which is a disk-shaped member heated by an electric heater or the like and placed below a sapphire substrate 1 in opposition to its front surface. The preheat plate 11 is disposed on an upper surface of a support plate 6a so as to be spaced by a predetermined interval, e.g., an interval of a few mm away from the sapphire substrate 1 by support portions 7a projected from the support plate 6a of the support table 6, which is disposed in opposition to a hot plate 3 in a manner similar to the first embodiment, and preheats the sapphire substrate 1.

The support portions 7a employed in the present embodiment support a peripheral edge portion 1a of the sapphire substrate 1 placed thereon, and respectively support the sapphire substrate 1 at a predetermined interval defined between the hot plate 3 and the support table 6a in such a manner that the interval between the front surface of the sapphire substrate 1 and the upper surface of the preheat plate 11 reaches the above interval. Further, the support portions 7a support the sapphire substrate 1 in such a manner that the back surfaces of the hot plate 3 and the sapphire substrate 1 are opposite to each other.

The support table 6 employed in the present embodiment comprises the disk-shaped support table 6a having an outside diameter substantially equal to an outside diameter of the sapphire substrate 1 (indicated by a chain double-dashed line in FIG. 5) attached to an elevation shaft 12 of an elevating device 5 by junctions or the like, and the support portions 7a which protrude from three points of a peripheral edge portion of the support plate 6a. The support table 6 is moved up and down by the elevation shaft 12.

In FIG. 6, the operation of the above constitution will be explained.

Figure 6A:
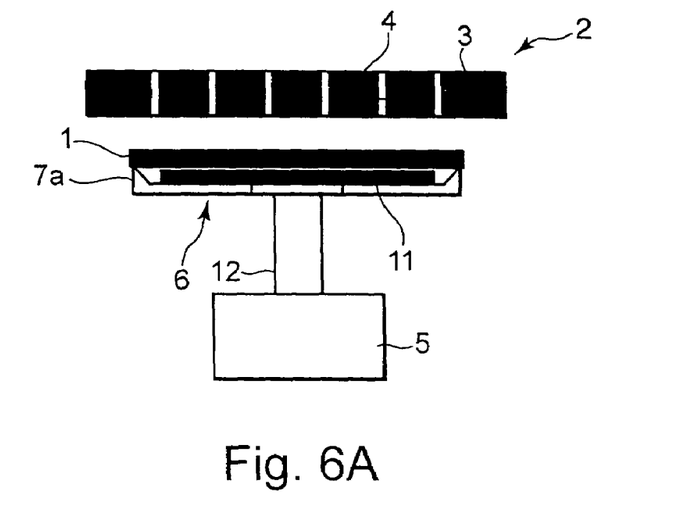
FIG. 6 is an explanatory view showing the operation of the semiconductor manufacturing apparatus according to the second embodiment.

In FIG. 6(a), when the semiconductor device is manufactured by using the semiconductor manufacturing apparatus 2 while warpage of the sapphire substrate 1 is being suppressed, the hot plate 3 for heating the sapphire substrate 1, the support table 6 having the support table 6a and the support portions 7a and provided with being spaced away from the hot plate 3 by the predetermined interval, the preheat plate 11 placed on the support table 6 with being spaced away from the hot plate 3 by a predetermined interval, and the elevating device 5 for moving the support table 6 up and down are prepared. The front surface of the sapphire substrate 1 is turned upside down and the sapphire substrate 1 is placed on the support portions 7a at the edge portion of the support table 6 through the peripheral edge portion 1a. Thus, the sapphire substrate 1 is provided between the hot plate 3 and the preheat plate 11 through the support portions 7a with being respectively spaced away from one another by a predetermined interval. Further, the back surfaces of the hot plate 3 and sapphire substrate 1 and the front surfaces of the preheat plate 11 and sapphire substrate 1 are respectively provided so as to be opposite to one another.

Next, the preheat plate 11 is set to a set temperature of the same degree as the hot plate 3, preferably, a set temperature of a set temperature of the hot plate 3 ±40° C. to preheat the sapphire substrate 1.

Thereafter, the elevation shaft 12 is elevated by the elevating device 5 to stop the back surface of the sapphire substrate 1 preheated from the front surface at a position spaced by an interval of a few mm from the lower surface of the hot plate 3 placed in a set temperature of 400° C.

Figure 6B:
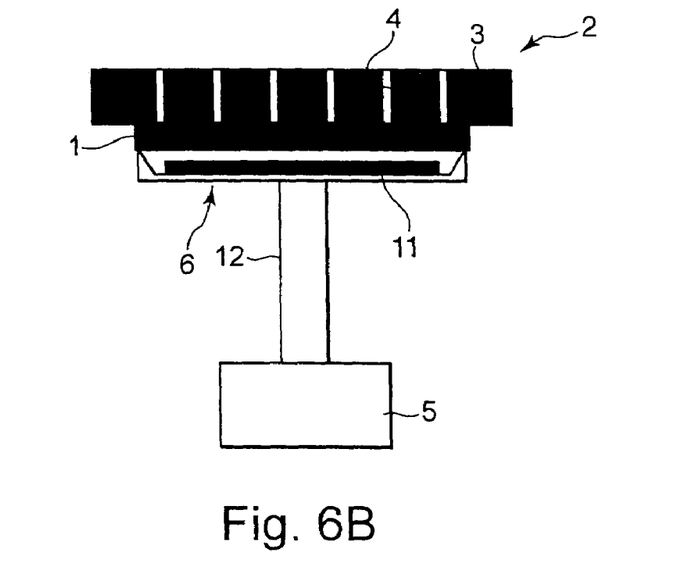

In FIG. 6(b), the front and back surfaces of the sapphire substrate 1 are preheated and heated up by heating of the temperature-raised preheat plate 11 and heat transfer of the temperature-raised hot plate 3. Further, the elevation shaft 12 is elevated when the sapphire substrate 1 is preheated to 320° C. or higher and the temperature thereof rises, whereby the back surface of the sapphire substrate 1 is brought into contact with the lower surface of the hot plate 3 and the sapphire substrate 1 is sucked and held by the hot plate 3 under vacuum supplied from an unillustrated vacuum pump or the like to suction holes 4.

Figure 6C:
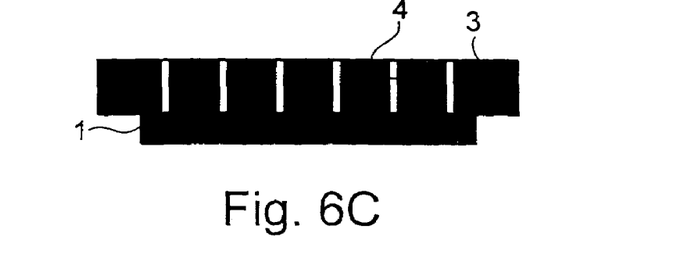

In FIG. 6(c), after the sapphire substrate 1 has been held by the hot plate 3, the elevation shaft 12 is moved downward to retract the support table 6 from the held sapphire substrate 1, whereby predetermined process work in the corresponding process is started.

Incidentally, the set temperature of the preheat plate 11 is set to the set temperature of the set temperature of the hot plate 3 ±40° C. because the difference between the temperature of the front surface of the sapphire substrate 1 preheated thereby and the set temperature of the hot plate 3 can be set to within 80° C.

Thus, even when both of the front and back surfaces of the sapphire substrate are preheated to nearly equal temperatures by the preheat plate and the hot plate, the entire sapphire substrate can be preheated to a substantially uniform temperature. Thus, an advantageous effect similar to the first embodiment can be obtained.

Incidentally, the support table employed in the present embodiment may be provided with a shielding cover similar to that employed in the first embodiment, which surrounds the support table.

Third Preferred Embodiment

Figure 7:
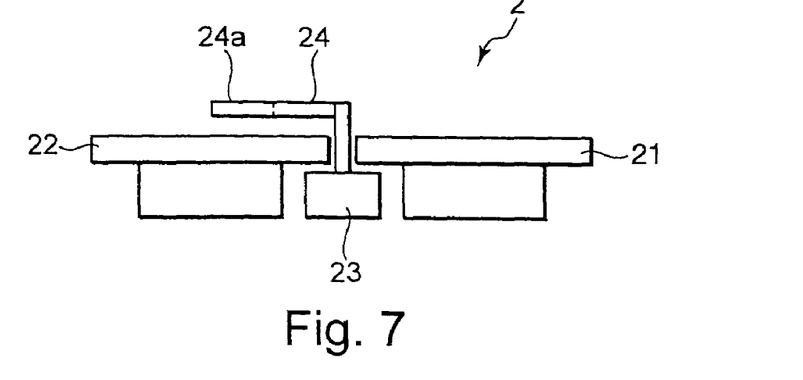
FIG. 7 is an explanatory view depicting a semiconductor manufacturing apparatus according to a third embodiment.

FIG. 7 is an explanatory view showing a semiconductor manufacturing apparatus according to a third embodiment.

Incidentally, elements similar to those employed in the first and second embodiments are given the same reference numerals and their explanations will be omitted.

In FIG. 7, reference numeral 21 indicates a hot plate, which is heated by an electric heater or the like and heats a sapphire substrate 1 placed on its upper surface and which is used as a working table for process work in the corresponding process performed while heating the sapphire substrate 1.

Reference numeral 22 indicates a preheat plate, which is provided in the vicinity of the hot plate 21 and heated by an electric heater or the like, and which has the function of preheating the sapphire substrate 1 placed on its upper surface and lifting the sapphire substrate 1 from the upper surface by means of an unillustrated lift pin.

Reference numeral 23 indicates a transfer mechanism provided with a conveying or transfer arm 24 having a fork-like fork section 24a at its tip and has the function of inserting the fork section 24a of the conveying arm 24 into the sapphire substrate 1 preheated by the preheat plate 22 and lifted by the lift pin, thereby lifting and holding the sapphire substrate 1 and transferring it onto the upper surface of the hot plate 21.

The operation of the above constitution will be explained.

Figure 8A:
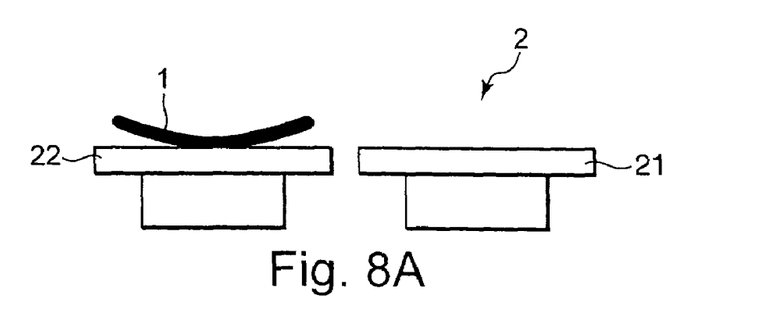
FIG. 8 is an explanatory view showing the operation of the semiconductor manufacturing apparatus according to the third embodiment.
Figure 8B:
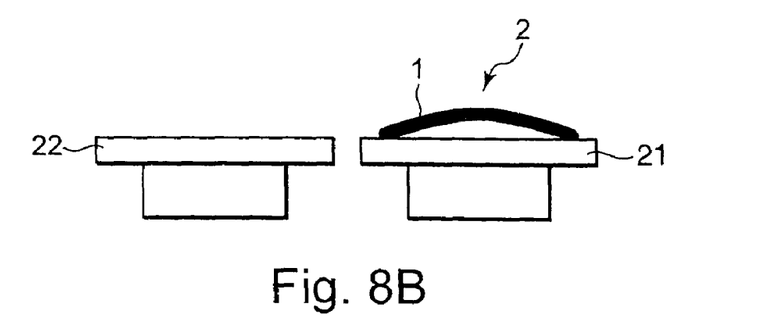

FIG. 8 is an explanatory view showing the operation of the semiconductor manufacturing apparatus according to the third embodiment.

Incidentally, FIG. 8 shows the semiconductor manufacturing apparatus in a state in which the illustration of the transfer mechanism 23 is being omitted.

When a semiconductor device is fabricated using the semiconductor manufacturing apparatus 2 while warpage of the sapphire substrate 1 is being suppressed, the sapphire substrate 1, the hot plate 21 set to a temperature (e.g., 400° C.) greater than or equal to 300° C., the preheat plate 22 set to a temperature (e.g., 500° C.) exceeding the set temperature of the hot plate 21, and the transfer mechanism 23 for lifting the sapphire substrate 1 placed on the preheat plate 22 and transferring it onto the upper surface of the hot plate 21 are prepared. When the sapphire substrate 1 is placed on the supper surface of the preheat plate 22 set to a set temperature higher than the set temperature of the hot plate 21 from its back surface and then raised in temperature, a peripheral edge portion 1a of the sapphire substrate 1 placed on the preheat plate 22 is lifted in a manner similar to the case described using FIG. 10(b) and warped in the form of such a bowl that its central portion contacts the preheat plate 22, so that the sapphire substrate 1 is preheated ununiformly. Since, however, the set temperature of the preheat plate 22 is high, the sapphire substrate 1 is preheated to higher than or equal to the set temperature of the hot plate 21 (FIG. 8(a)).

When the temperature of the peripheral edge portion 1a of the sapphire substrate 1 is preheated to above the set temperature (400° C.) of the hot plate 21, the sapphire substrate 1 is lifted by the unillustrated lift pin of the preheat plate 22, and the fork section 24a of the conveying arm 24 of the transfer mechanism 23 is inserted into the back surface side of the sapphire substrate 1 to lift the sapphire substrate 1, after which the sapphire substrate 1 is quickly transferred onto the upper surface of the hot plate 21 while it is being placed in a state of being warped in the bowl form. Since, at this time, the central portion of the sapphire substrate 1 warped in the bowl form is brought into contact with the hot plate 21 held at a temperature lower than its preheated temperature, the sapphire substrate 1 is lowered in temperature and the central portion is shrunk in a manner similar to the case described using FIG. 10(e), whereby the sapphire substrate 1 is brought to a state of being warped in the form of a bell whose central portion is lifted up (FIG. 8(b)).

Figure 8C:
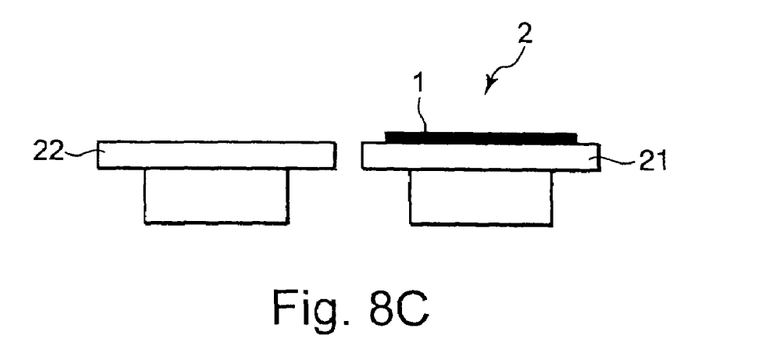

When a few ten of seconds have elapsed, the entire sapphire substrate 1 approaches the set temperature (400° C.) of the hot plate 21, so that the sapphire substrate 1 warped in the bell form on the hot plate 21 is brought to a state free of its warpage, thus resulting in a flat plate, whereby the back surface of the sapphire substrate 1 is placed on its upper surface in a state of being brought into contact with the upper surface of the hot plate 21 (FIG. 8(c)).

Thereafter, predetermined process work in the corresponding process is started.

In this case, it is desirable that the temperature exceeding the set temperature of the hot plate 21 corresponding to the set temperature of the preheat plate 22 is of a high temperature higher than or equal to 80° C.

Thus, even where the sapphire substrate preheated on the preheat plate is transferred onto the hot plate, the entire sapphire substrate can be set to a substantially uniform temperature on the hot plate and hence an advantageous effect similar to the first embodiment can be obtained.

Since the back surface of the sapphire substrate is brought into contact with the preheat plate and the hot plate and directly heated, the possibility that foreign substances such as dust will be adhered to the front surface of the sapphire substrate can be suppressed to the minimum.

Fourth Preferred Embodiment

Figure 9:
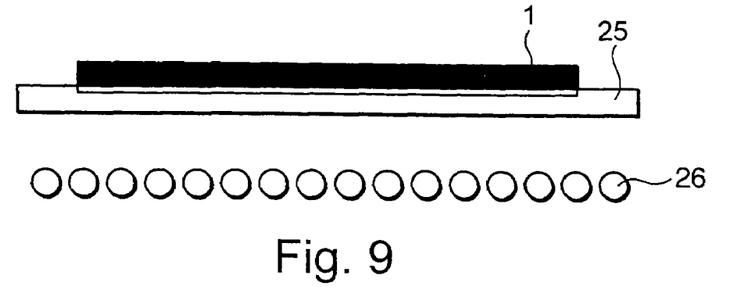
FIG. 9 is an explanatory view illustrating a semiconductor manufacturing apparatus according to a fourth embodiment.

FIG. 9 is an explanatory view showing a semiconductor manufacturing apparatus according to a fourth embodiment.

Incidentally, elements similar to those employed in the first embodiment are given the same reference numerals, and their explanations will be omitted.

In FIG. 9, reference numeral 25 indicates a hot plate used as a working table which is heated by heat radiated from lamps 26 and heats a sapphire substrate 1 placed on its upper surface and which is suitable for process work in the corresponding process carried out while heating the sapphire substrate 1.

Each of the lamps 26 is a lamp which radiates heat or thermal rays by its energization to heat the hot plate 25. The lamps 26 are disposed below the hot plate 25 with the direction of radiation of the heat rays being directed to the undersurface of the hot plate 25.

The operation of the above constitution will be explained.

When a semiconductor device is manufactured using the semiconductor manufacturing apparatus 2 while warpage of the sapphire substrate 1 is being suppressed, the sapphire substrate 1, the hot plate 25 on which the sapphire substrate 1 is placed and at which process work is performed at a set temperature of 300° C. or higher, and the lamps 26 which radiate the heat rays by energization to heat the hot plate 25, are prepared. The sapphire substrate 1 is placed on the upper surface of the hot plate 25 from its back surface, and the lamps 26 are energized to heat the hot plate 25 to a temperature (called preheat set temperature, 500° C. in the present embodiment) exceeding a set temperature (called process set temperature, 400° C. in the present embodiment) at the process work. In this case, the sapphire substrate 1 is warped in the form of such a bowl that its central portion is brought into contact with the hot plate 25 in a manner similar to one on the preheat plate 22 shown in FIG. 8(a), so that the sapphire substrate 1 is ununiformly preheated. Since, however, the preheat set temperature is high, the sapphire substrate 1 is preheated to greater than the process set temperature of the hot plate 25. When the temperature of a peripheral edge portion 1a of the sapphire substrate 1 reaches the process set temperature (400° C.) or higher, the lamps 26 are de-energized or power supplied thereto is reduced to cool the hot plate 25 by outgoing radiation and lower its temperature. When the temperature of the hot plate 25 reaches the process set temperature, the lamps 26 are energized again or the power supplied thereto is increased to maintain the temperature of the hot plate 25 at the process set temperature (400° C.).

At this time, the central portion of the sapphire substrate 1 warped in the bowl form is lowered in temperature with the reduction in the temperature of the hot plate 25. Further, the entire sapphire substrate 1 approaches the process set temperature (400° C.) of the hot plate 25, so that the sapphire substrate 1 is brought to a state free of its warpage, thus resulting in a flat plate, whereby the back surface of the sapphire substrate 1 is placed on its upper surface in a state of being brought into contact with the upper surface of the hot plate 25.

Thereafter, predetermined process work in the corresponding process is started.

In this case, it is desirable that the temperature exceeding the process set temperature of the hot plate 25 corresponding to the preheat set temperature is of a high temperature higher than or equal to 80° C.

Thus, even where the sapphire substrate preheated on the hot plate is set to the process set temperature with the reduction in the temperature of the hot plate, an advantageous effect similar to the third embodiment can be obtained.

Heating the hot plate by using the lamps makes it possible to quickly perform an increase in the temperature of the hot plate and a decrease in its temperature and shorten a working time necessary for the entire process.

Incidentally, although the present embodiment has explained the case in which the cooling of the hot plate is performed by outgoing radiation, a cooling plate may be pressed against the lower surface of the hot plate or fluid such as cooling gas or liquid may be allowed to flow into the hot plate to positively perform cooling. If done in this way, then the shortening of the working time for the entire process can further be attained.

Incidentally, although each of the respective embodiments has described the substrate introduced on the semiconductor manufacturing apparatus of the present invention as the sapphire substrate, the introduced substrate is not limited to the above. It may be a sapphire wafer provided with such a device forming layer that a crystal layer such as silicon, gallium nitride (GaN) is epitaxially grown on a sapphire substrate to form a semiconductor element such as a MOSFET (MOS (Metal Oxide Semiconductor) Field Effect Transistor), a light-emitting diode or the like. Even when the sapphire wafer is introduced on the semiconductor manufacturing apparatus of the present invention as the substrate, an advantageous effect similar to the above can be obtained if the semiconductor manufacturing apparatus of the present invention is used.

Although each of the respective embodiments has explained the semiconductor manufacturing apparatus of the present invention as the atmospheric-pressure CVD apparatus, the semiconductor manufacturing apparatus to which the present invention is applied, is not limited to the above. It may be a reduced-pressure CVD apparatus, a sheet-fed type plasma CVD apparatus, a lamp thermal treatment apparatus, a peeling apparatus for a photoresist or the like, an etching apparatus or the like. In brief, if the semiconductor manufacturing apparatus of the present invention is applied to a process that needs to perform process work while heating a sapphire substrate or a sapphire wafer using it at a relatively low atmosphere temperature, then an advantageous effect similar to the above can be obtained.

While the preferred forms of the present invention have been described, it is to be understood that modifications will be apparent to those skilled in the art without departing from the spirit of the invention. The scope of the invention is to be determined solely by the following claims.

As described above, according to the invention, a semiconductor manufacturing apparatus comprises a hot plate which heats a sapphire substrate, a support table having a support plate disposed with being spaced away from the hot plate by a predetermined interval, and support portions which respectively support the sapphire substrate with being spaced by a predetermined interval between the hot plate and the support plate and support the sapphire substrate in such a manner that back surfaces of the hot plate and the sapphire substrate are opposite to each other, an elevating device which moves the support table up and down, and a shielding cover which externally blocks off spacing defined between the hot plate and the sapphire substrate and spacing defined between the sapphire substrate and the support plate.

It is preferable that the inner surfaces of the shielding cover are respectively brought into mirror surfaces.

It is also preferable that the predetermined interval between the sapphire substrate and the hot plate is set to a range from over 1 mm to under 5 mm.

As described above, according to the invention, a semiconductor manufacturing apparatus comprises a hot plate which heats a sapphire substrate, a support table having a support plate disposed with being spaced away from the hot plate by a predetermined interval, and support portions which respectively support the sapphire substrate with being spaced by a predetermined interval between the hot plate and the support plate and support the sapphire substrate in such a manner that back surfaces of the hot plate and the sapphire substrate are opposite to each other, an elevating device which moves the support table up and down, and a preheat plate spaced away from the sapphire substrate by a predetermined interval and placed over the support table so as to be opposite to a front surface of the sapphire substrate.

It is preferable that a set temperature of the preheat plate is the same degree as a set temperature of the hot plate.

As described above, according to the invention, a semiconductor manufacturing apparatus comprises a hot plate which heats a sapphire substrate, a preheat plate which preheats the sapphire substrate disposed in the vicinity of the hot plate, and a transfer mechanism which transfers the sapphire substrate preheated on the preheat plate onto the hot plate.

It is preferable that a set temperature of the preheat plate is a temperature which exceeds a set temperature of the hot plate.

It is also preferable that the temperature exceeding the set temperature of the hot plate is a temperature set higher by 80° C. or more than the set temperature.

As described above, according to the invention, a semiconductor manufacturing apparatus comprises a hot plate which heats a sapphire substrate and is used as a working table for process work of the sapphire substrate, wherein the sapphire substrate placed over the hot plate is heated at a temperature exceeding a set temperature of the holt plate prior to the process work.

It is preferable that the hot plate is heated using lamps.

It is also preferable that the set temperature of the hot plate is greater than or equal to 300° C.

FIG. 1

Explanatory view showing section of semiconductor manufacturing apparatus according to first embodiment

FIG. 2

Explanatory view showing top surface of semiconductor manufacturing apparatus according to first embodiment

FIG. 3

Explanatory view showing operation of semiconductor manufacturing apparatus according to first embodiment

FIG. 4

Explanatory view showing section of semiconductor manufacturing apparatus according to second embodiment

FIG. 5

Explanatory view showing top surface of semiconductor manufacturing apparatus according to second embodiment

FIG. 6

Explanatory view showing operation of semiconductor manufacturing apparatus according to second embodiment

FIG. 7

Explanatory view showing semiconductor manufacturing apparatus according to third embodiment

FIG. 8

Explanatory view showing operation of semiconductor manufacturing apparatus according to third embodiment

FIG. 9

Explanatory view showing semiconductor manufacturing apparatus according to fourth embodiment

FIG. 10

Explanatory view showing manner of warpage of sapphire substrate

FIG. 11

Center of sapphire substrate center of silicon substrate peripheral edge portion of sapphire substrate temperature time graph showing changes in temperature of sapphire substrate heated in non-contact form

What is claimed is:

1. A method for manufacturing a semiconductor comprising:
   preparing a hot plate which heats a sapphire substrate, a support table having a support plate and support portions and disposed as being spaced away from the hot plate by a first interval, and an elevating device which moves the support table up and down;
   disposing the sapphire substrate by the support portions as being respectively spaced between the hot plate and the support table, in such a manner that back surfaces of the hot plate and the sapphire substrate are opposite to each other, the sapphire substrate being spaced away from the hot plate by a second interval and being spaced away from the support table by a third interval;
   externally blocking off spacing defined between the hot plate and the sapphire substrate, and spacing defined between the sapphire substrate and the support table;
   after blocking off thereof from outside, heating up the hot plate to thereby heat up the sapphire substrate; and
   elevating the support table by the elevating device to bring the back surface of the heated-up sapphire substrate into contact with the hot plate.

2. The method according to claim 1, wherein the second interval defined between the sapphire substrate and the hot plate is set to a range from over 1 mm to under 5 mm.

3. The method according to claim 1, wherein said externally blocking off the spacing defined between the hot plate and the sapphire substrate and the spacing defined between the sapphire substrate and the support table is performed by providing a shielding cover whose inner faces are mirror surfaces.

4. The method according to claim 3, wherein the second interval defined between the sapphire substrate and the hot plate is set to a range from over 1 mm to under 5 mm.

5. A method for manufacturing a semiconductor comprising:
   preparing a hot plate which heats a sapphire substrate, a support table having a support plate and support portions disposed as being spaced away from the hot plate by a first interval, a preheat plate disposed over the support table as being spaced away from the hot plate by a second interval, and an elevating device which moves the support table up and down;
   disposing the sapphire substrate by the support portions as being respectively spaced between the hot plate and the preheat plate, in such a manner that back surfaces of the hot plate and the sapphire substrate and front surfaces of the preheat plate and the sapphire substrate are respectively opposite to one another, the sapphire substrate being spaced away from the hot plate by a third interval and being spaced away from the support table by a fourth interval;
   heating up the hot plate and the preheat plate to thereby heat up the sapphire substrate; and
   elevating the support table by the elevating device to bring the pack surface of the heated-up sapphire substrate into contact with the hot plate.

6. The method according to claim 5, wherein said heating up the sapphire substrate is performed with a set temperature of the preheat plate being set the same as a set temperature of the hot plate.

7. A method for manufacturing a semiconductor, comprising:
   preparing a sapphire substrate, a hot plate set to a temperature of 300° C. or higher, and a preheat plate set to a temperature exceeding the set temperature of the hot plate;
   placing the sapphire substrate over the preheat plate to heat up the sapphire substrate; and transferring the heated-up sapphire substrate from the preheat plate to the hot plate to thereby cool down the sapphire substrate.

8. The method according to claim 7, wherein the set temperature of the preheat plate is a temperature set higher by 80° C. or more than the set temperature of the hot plate.

9. A method for manufacturing a semiconductor, comprising:

preparing a sapphire substrate, and a hot plate which is placed over the sapphire substrate and at which process work is performed at a set temperature greater than or equal to 300° C.;

setting the hot plate to a temperature exceeding the set temperature;

placing the sapphire substrate over the hot plate set to the temperature exceeding the set temperature; and cooling the hot plate down to the set temperature to thereby cool down the sapphire substrate.

10. The method according to claim 9, wherein the temperature exceeding the set temperature is a temperature set higher by 80° C. or above than the set temperature.

11. The method according to claim 9, wherein the step for setting the hot plate to the temperature exceeding the set temperature is performed by heating of lamps.

12. The method according to claim 11, wherein the temperature exceeding the set temperature is a temperature set higher by 80° C. or above than the set temperature.

* * * * *